United States Patent [19]

Iwamoto et al.

[11] Patent Number: 5,168,512
[45] Date of Patent: Dec. 1, 1992

[54] METHOD OF MANUFACTURE OF SEMICONDUCTOR DEVICES

[75] Inventors: Kazunori Iwamoto, Yokohama; Nobutoshi Mizusawa, Yamato; Takao Kariya; Shunichi Uzawa, both of Tokyo; Ryuichi Ebinuma, Kawasaki, all of Japan

[73] Assignee: Canon Kabushiki Kaisha, Tokyo, Japan

[21] Appl. No.: 668,238

[22] Filed: Mar. 12, 1991

[30] Foreign Application Priority Data

Mar. 13, 1990 [JP] Japan .................................. 2-059905
Mar. 15, 1990 [JP] Japan .................................. 2-062753

[51] Int. Cl.⁵ ............................................. G21K 5/00
[52] U.S. Cl. ..................................... 378/34; 378/210
[58] Field of Search .......................................... 378/34

[56] References Cited

U.S. PATENT DOCUMENTS 5,001,734 3/1991 Uda et al. .

FOREIGN PATENT DOCUMENTS 6055624 3/1985 Japan .................................. 378/34

OTHER PUBLICATIONS

Physical Review B—vol. 26, No. 8, J. Stohr and R. Jaeger, "Absorption—Edge Resonances Core-Hole Screening . . . ," pp. 4111-4131.

Primary Examiner—Craig E. Church
Attorney, Agent, or Firm—Fitzpatrick, Cella, Harper & Scinto

[57] ABSTRACT

A method for the manufacture of semiconductor devices wherein a radiation beam including first and second beams is projected from a synchrotron orbit radiation source into an ambience maintained substantially at a vacuum, includes the steps of directing the radiation beam to a wafer through a window effective to isolate the ambience to thereby print a circuit pattern on an X-ray sensitive layer on the wafer with the first beam, providing a support for supporting the window having an opening, extracting the second beam through the opening, and detecting and correcting any deviation of the first beam with respect to the wafer.

25 Claims, 14 Drawing Sheets

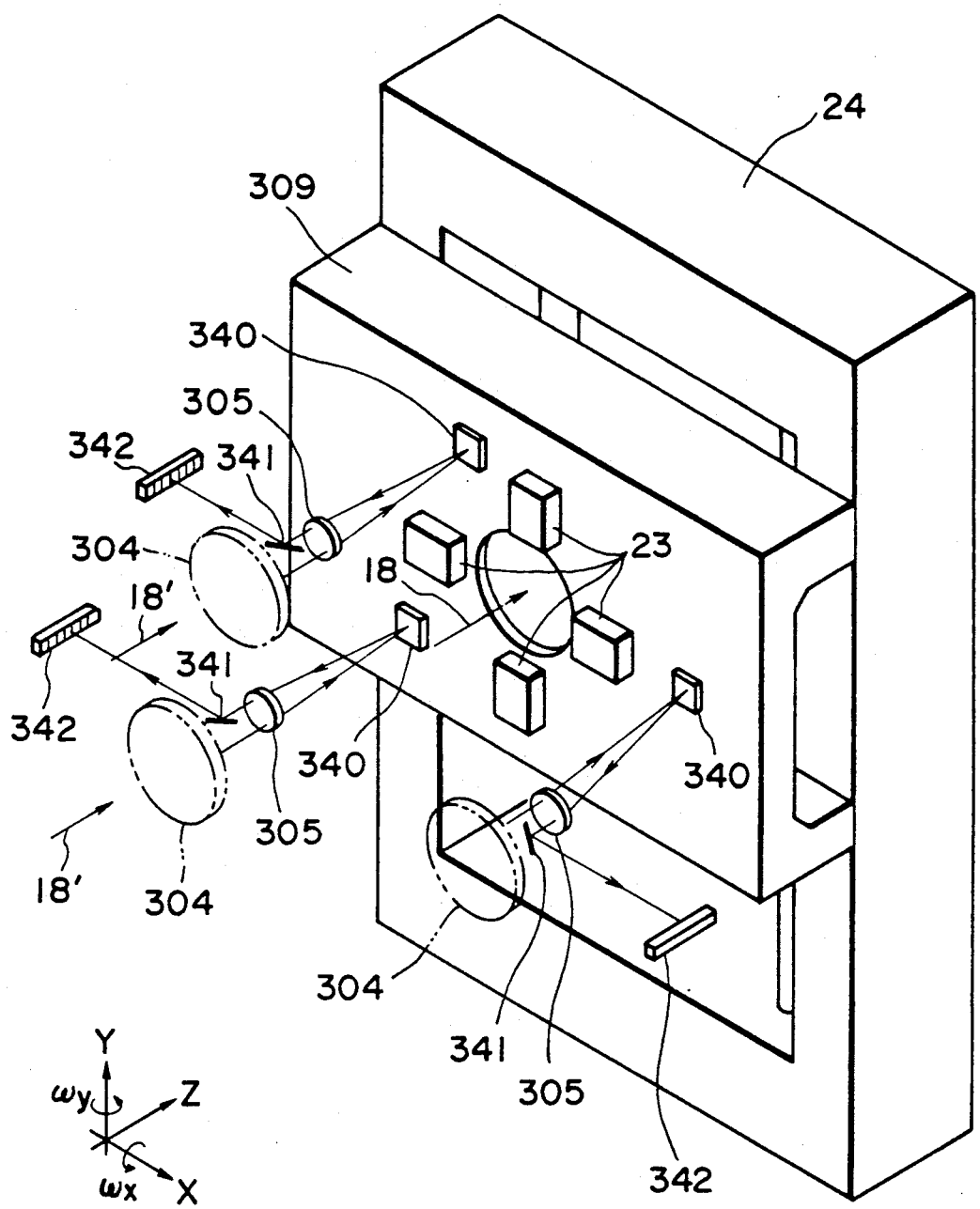
FIG. II

METHOD OF MANUFACTURE OF SEMICONDUCTOR DEVICES

FIELD OF THE INVENTION AND RELATED ART

This invention relates generally to a method of manufacture for the semiconductor devices and, more particularly, to an exposure apparatus for transferring and printing an image of an original, such as a mask, onto a workpiece such as a semiconductor wafer, with high precision.

With the recent increasing degree of integration of semiconductor integrated circuit, in an exposure apparatus (aligner) for the manufacture of the same, further enhancement of transfer precision is required. As an example, for an integrated circuit of 256 megabit DRAM, an exposure apparatus capable of printing a pattern of $1a$ linewidth of 0.25 micron order is necessary.

As such super-fine pattern printing exposure apparatus, an exposure apparatus which uses synchrotron orbit radiation light (SOR X-rays) has been proposed.

The orbit radiation light has a sheet beam shape, uniform in a horizontal direction. Thus, for exposure of a a plane of certain area, many proposals have been made, such as follows:

(1) a scan exposure method wherein a mask and a wafer are moved in a vertical direction whereby the surface is scanned with X-rays of sheet beam shape in a horizontal direction;

(2) a scan mirror exposure method wherein X-rays of a sheet beam shape are reflected by an oscillating mirror whereby a mask and a wafer are scanned in a vertical direction; and (3) a simultaneous exposure method wherein X-rays of a sheet beam shape in a horizontal direction are diverged in a vertical direction by an X-ray mirror having a reflection surface machined into a convex shape, whereby an exposure region as a whole is irradiated simultaneously (Japanese Laid-Open Patent Application No. 243519/1989).

In SOR X-ray exposure apparatuses, a SOR device which is a light source for providing exposure light is separate from a main assembly of the exposure apparatus in which a mask and a wafer are set. For this reason, a change in the attitude of the main assembly of the exposure apparatus or a change in the light emission point of the SOR device, for example, will cause a large change in the relative position (or attitude) between an exposure region (mask and wafer) and the SOR X-ray bundle (SOR beam), as compared with conventional exposure apparatuses wherein a light source is included in a main assembly. In the SOR X-ray exposure apparatus, such a change in attitude leads to deterioration of the transfer precision.

Particularly, in the proximity exposure process, a change in the angle of incidence of illumination light to the exposure region results in degradation of the superposing precision. For example, if the proximity gap G between a mask and a wafer is 50 microns, then, in order to suppress a superposition error $\Delta\delta$ due to a change in the angle of incidence of the exposure illumination light to a quantity not greater than 1/100 of the pattern linewidth, that is, not greater than 0.002 micron, the change $\Delta\theta$ in the angle of incidence has to be suppressed to satisfy:

$$\Delta\theta = \Delta\delta/G < 0.002/50 = 4 \times 10^{-5} \text{ (rad)}$$

Namely, it has to be suppressed to a quantity not greater than $4 \times 10^{-5}$ rad.

Further, since in the SOR exposure apparatus of the type described above the exposure light has a divergent angle, the angle of incidence of the illumination light to the mask and the wafer changes with the shift $\Delta y$ of the relative position of the illumination light to the mask and the wafer. If the interval between the surface to be exposed and the point of divergence (e.g. the position of incidence of X-rays upon a divergence convex mirror of a SOR X-ray exposure apparatus) is 5 m, then the quantity $\Delta\theta$ of change in the angle of incidence is given by:

$$\Delta\theta = \Delta y / 5000 < 4 \times 10^{-5} \text{ (rad)}$$

From this change $\Delta\theta$ in the angle of incidence, the above-described superposition error $\Delta\theta$ results. The superposition error $\Delta\theta$ in this case appears at different portions of the surface to be exposed, as as run-out error of distributed transfer magnifications. From the above equation, it is seen that the change $\Delta y$ in the relative position has to be suppressed to a quantity not greater than 0.2 mm.

In the SOR exposure apparatus of the type described above, the SOR beam (illumination light) has uniform intensity in a horizontal direction (hereinafter "X direction"). However, in a vertical direction (hereinafter "Y direction"), it has an intensity distribution (profile) wherein the intensity is high at a central portion and decreases with an increasing spacing therefrom. Conventionally, an exposure time distribution corresponding to such a profile of intensity distribution in the vertical direction of the illumination light is set to thereby attain a uniform quantity of exposure throughout the exposure region. However, if there occurs a deviation $\Delta y$ between the profile curve and an exposure time distribution curve, then the X-ray intensity I at a position y changes by "$(dI/dy) \times \Delta y$". Accordingly, in order to suppress the change in intensity I to a quantity not greater than 0.1%, the following relation has to be satisfied:

$$\Delta y < (1/1000) \times [1/(dI/dy)]$$
$$= (1/1000) \times \{1/[(dI/I)/dy)]\}$$

More particularly, if the view-angle size of the exposure region in the Y direction is 30 mm, if the profile is represented by a quadratic function which is vertically symmetric with respect to a center line and if the lowest intensity is 80% of the highest intensity, then it follows that:

$$\Delta y < (1/1000) \times [1/(0.4/15)] \approx 0.04 \text{ (mm)}$$

Thus, it is seen that, in order to suppress nonuniformness in intensity to a quantity not greater than 0.1%, the shift $\Delta y$ in relative position of the exposure light to the exposure region has to be kept at a quantity not greater than 40 microns.

As regards the variation $\Delta y$, one which is attributable to an attitude change of the exposure apparatus resulting from movement of a wafer stage may be of about 200 microns, a relative displacement resulting from a temperature change may be of about 10 microns and a relative displacement resulting from vibration of a floor may be of about 2 microns.

As described, in a SOR X-ray exposure apparatus, a change in attitude of a SOR beam (exposure light) relative to a mask and a wafer causes deterioration of the transfer precision. Accordingly, there is the necessity for control to maintain a constant attitude of the SOR beam relative to the mask and the wafer. For such attitude control, it is necessary to use a detection system for detecting the attitude of the SOR beam relative to the mask and the wafer.

As such detecting system for the SOR beam, examples are known wherein a metal wire such as tungsten is disposed in the path of the SOR light and photo-electrons emitted from the metal wire are detected by using a micro-channel plate (MCP) or the like ("Physical Review", 82 B Vol. 26, page 4112), or wherein a photodiode or the like based on photoelectromotive force effect of semiconductor is used.

However, such a detecting system involves the following inconveniences.

That is, with the system that uses a metal wire, measurement is possible only within a high vacuum. Namely, in an exposure ambience of an atmospheric pressure or a pressure of several hundred torrs, measurement is not possible. This leads to the necessity that the metal wire and the MCP are disposed within an ultra-high vacuum ambience and a high voltage is applied to the MCP. Thus, the mechanism is quite complicated.

In the system that uses a photodiode, if the photodiode is disposed at a ultra-high vacuum side, a similar problem as the metal wire system arises. Also, when it is applied to an exposure apparatus and is disposed in an exposure ambience, if the mechanism is structured so that the photodiode is moved to the exposure region in the non-exposure period and is retracted out of the exposure region at the exposure period, real-time measurement in the exposure period is not possible. Further, wasted time must be spent from the measurement process to the exposure process.

SUMMARY OF THE INVENTION

It is accordingly an object for the present invention to provide an improved method of manufacture of semiconductor devices.

It is another object of the present invention to provide an improved exposure apparatus for the manufacture of semiconductor devices.

In accordance with a first aspect for the present invention, there is provided a method of manufacture of semiconductor devices wherein a radiation beam is projected from a synchrotron orbit radiation source into an ambience maintained substantially at a vacuum, and wherein a first beam which is a portion of the radiation beam is directed to a wafer through a window effective to isolate the ambience to thereby print a circuit pattern on an X-ray sensitive layer on the wafer with the first beam: wherein an opening is formed at least in a portion of a support for supporting the window; wherein a second beam which is another portion of the radiation beam is extracted through the opening; and wherein by using the second beam any deviation of the first beam with respect to the wafer is detected and corrected.

In accordance with a second aspect of the present invention, there is provided a method for the manufacture of semiconductor devices wherein a radiation beam is projected from a synchrotron orbit radiation source into an ambience maintained substantially at a vacuum, and wherein a first beam which is a portion of the radiation beam is directed to a wafer through a window effective to isolate the ambience to thereby print a circuit pattern on an X-ray sensitive layer on the wafer with the first beam: wherein an opening is formed at least in a portion of a support for supporting the window; wherein a second beam which is another portion of the radiation beam is extracted through the opening; and wherein an intensity of the first beam is detected on the basis of an intensity of the second beam.

In accordance with a third aspect of the present invention, there is provided an exposure apparatus for the manufacture of semiconductor devices, comprising: a synchrotron orbit radiation source; a beam line having a window supported by a support with an opening formed at least in a portion thereof, the inside of the beam line being maintained substantially at a vacuum through which a radiation beam from the synchrotron radiation source can be propagated so that a first beam which is a portion of the radiation beam can be projected from the window; and an exposure system for receiving the first beam from the window and for projecting the first beam to a circuit pattern, whereby an X-ray sensitive layer of a wafer can be exposed to the circuit pattern, the exposure system being effective to detect second beam which is another portion of the radiation beam through the opening of the support.

In accordance with a fourth aspect of the present invention, there is provided an exposure apparatus for the manufacture of semiconductor devices, for exposing an X-ray sensitive layer on a wafer to a circuit pattern of a mask, the apparatus comprising: a synchrotron orbit radiation source; a beam line having a beryllium window supported by a support, the support having an opening formed at least in a portion thereof and effective to absorb X-rays but to transmit visible light, the inside of the beam line being maintained substantially at a vacuum through which a radiation beam from synchrotron radiation source can be propagated so that a first beam which is a portion of the radiation beam can be projected from the window; and an exposure system for receiving the first beam from the window and for receiving a second beam from the opening of the support which second beam is another portion of the radiation beam, the exposure system directing the first beam to the circuit pattern of the mask; wherein the exposure system including a first stage for supporting the mask, a second stage for supporting the wafer, means for collecting the second beam, a sensor for receiving the second beam from the collecting means and for producing a signal corresponding to a position of incidence of the second beam, means for adjusting an attitude of the exposure system, and control means for detecting a deviation of the exposure system with respect to the first beam on the basis of the signal from the sensor and for controlling the adjusting means to substantially correct the deviation.

In one preferred form of the present invention, the window is provided by beryllium (beryllium film) while the opening of the support is covered by a material of $SiO_2$ having high purity. A sensor for receiving the second beam from the opening of the support may be fixed to the exposure system which may comprise a wafer stage and the like.

A radiation beam from a SOR source contains light rays ranging from the region of soft X-ray to the region of visible light. Additionally, both the X-ray and the visible light emanate from the same light emission point and advance in the same orientation, and only a small change occurs in the ratio of intensity therebetween. For this reason, in a preferred form of the present invention, a visible light component of the radiation beam is extracted through the opening of a support, and a photosensor of a well-known type is used to detect the visible light component. With such simple structure, the present invention makes it possible to detect a change in the position or in the angle of incidence of the radiation beam or X-rays of the radiation beam with reference to an exposure system or to detect a change in intensity of it.

As the sensor for receiving the second beam from the opening of the support, a one-dimensional line sensor or a two-dimensional area sensor capable of producing a signal corresponding to the position of incidence of a received beam, or, alternatively, a photodiode capable of transforming an integrated value of the quantity of a received beam into an output voltage, may be used. As for such one-dimensional line sensor or two-dimensional area sensor, a PSD or CCD may be used.

In another aspect, it is an object of the present invention to assure further enhancement of the transfer precision in an exposure apparatus of the type that an exposure light source is separate from a main assembly of the exposure apparatus.

In accordance with this aspect of the present invention, to achieve the above object, there is provided an exposure apparatus, comprising: a main assembly including an alignment device for positionally aligning an original and a substrate to be exposed, while substantially vertically holding them, and an anti-vibration system for supporting said alignment device thereon; an exposure light source for producing light in a direction which is substantially horizontal and which is substantially perpendicular to the original and the substrate, for transferring an image of the original onto the substrate; rotation actuator means for rotationally moving said alignment device about an axis of the substantially vertical direction; and means for detecting a deviation of an alignment optical axis of the alignment device which is an axis substantially perpendicular to the original and the substrate and an exposure optical axis which is an optical axis of the exposure light source, about the axis of the substantially vertical direction.

In one preferred form of the present invention, a bearing means for rotationally moving the alignment device about an axis of the substantially vertical direction is provided by the anti-vibration system itself, and the rotation actuator means comprises air spring means, constituting an anti-vibration system.

The detecting means for detecting a deviation ($\Delta\omega Y$) about the axis (Y axis) of the substantially vertical direction may be of known type. However, it is preferable to use a combination of a two-dimensional area sensor disposed with no relative positional deviation with respect to an original and a substrate, to be exposed, as aligned with each other, and an optical system for collecting a portion of exposure light, particularly a portion outside the exposure view angle, on the area sensor. Where the exposure light comprises SOR X-rays, by extracting a visible light component of the SOR beam through a glass filter resistive to radiation rays, it is possible to use a similar combination of an optical system and a two-dimensional area sensor.

The alignment optical axis is an axis that provides a reference for the alignment between the original and the substrate to be exposed. Ideally, it is placed in parallel to the exposure optical axis (Z axis). Any rotational deviation $\Delta\omega Y$ of the alignment optical axis about the Y axis directory leads to a deviation $\Delta\theta$ of an angle of incidence, and it causes a superposition error $\Delta\delta$.

In a preferred form of the present invention, there are provided means for detecting a rotational deviation $\Delta\omega Y$ and actuator means for rotationally moving the alignment device, namely, the alignment optical axis, about the Y axis. As a result, by driving the actuator means manually or automatically in accordance with the detected rotational deviation $\Delta\omega Y$, it is possible to correct the rotational deviation $\Delta\omega Y$.

With this aspect of the present invention, any rotational deviation $\Delta\omega Y$ of the alignment optical axis about the exposure optical axis (Z axis) can be corrected and, therefore, an exposure apparatus of enhanced transfer precision is assured.

It is a yet further object of the present invention to provide an exposure method and apparatus by which high-precision pattern printing is assured.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 6–11 are schematic representations, respectively, showing modified forms of the FIG. 3 structure.

DESCRIPTION OF THE PREFERRED EMBODIMENTS

Figure 1:
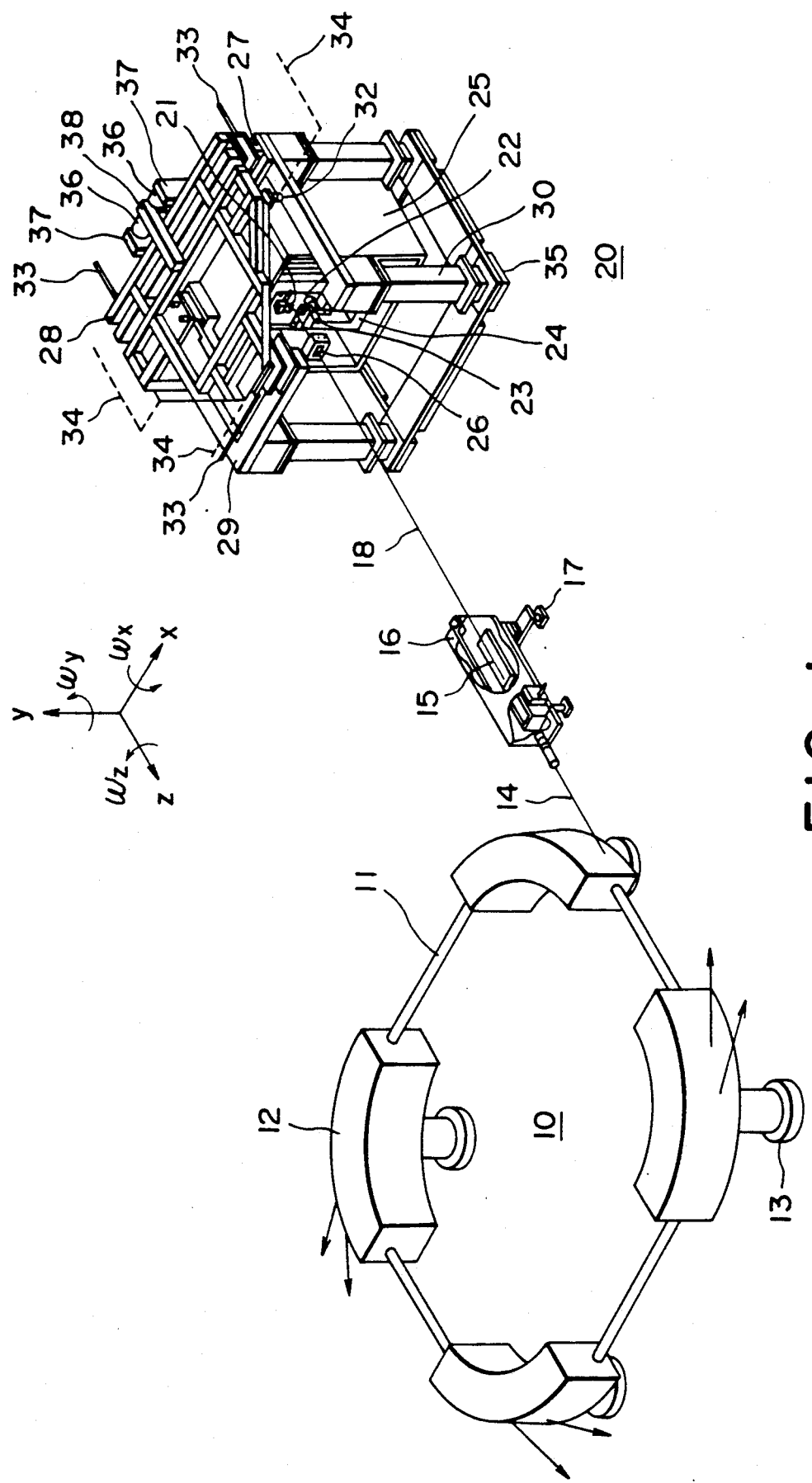
FIG. 1 is a perspective view, schematically showing a general structure of an X-ray exposure apparatus according to an embodiment of the present invention.
Figure 2:
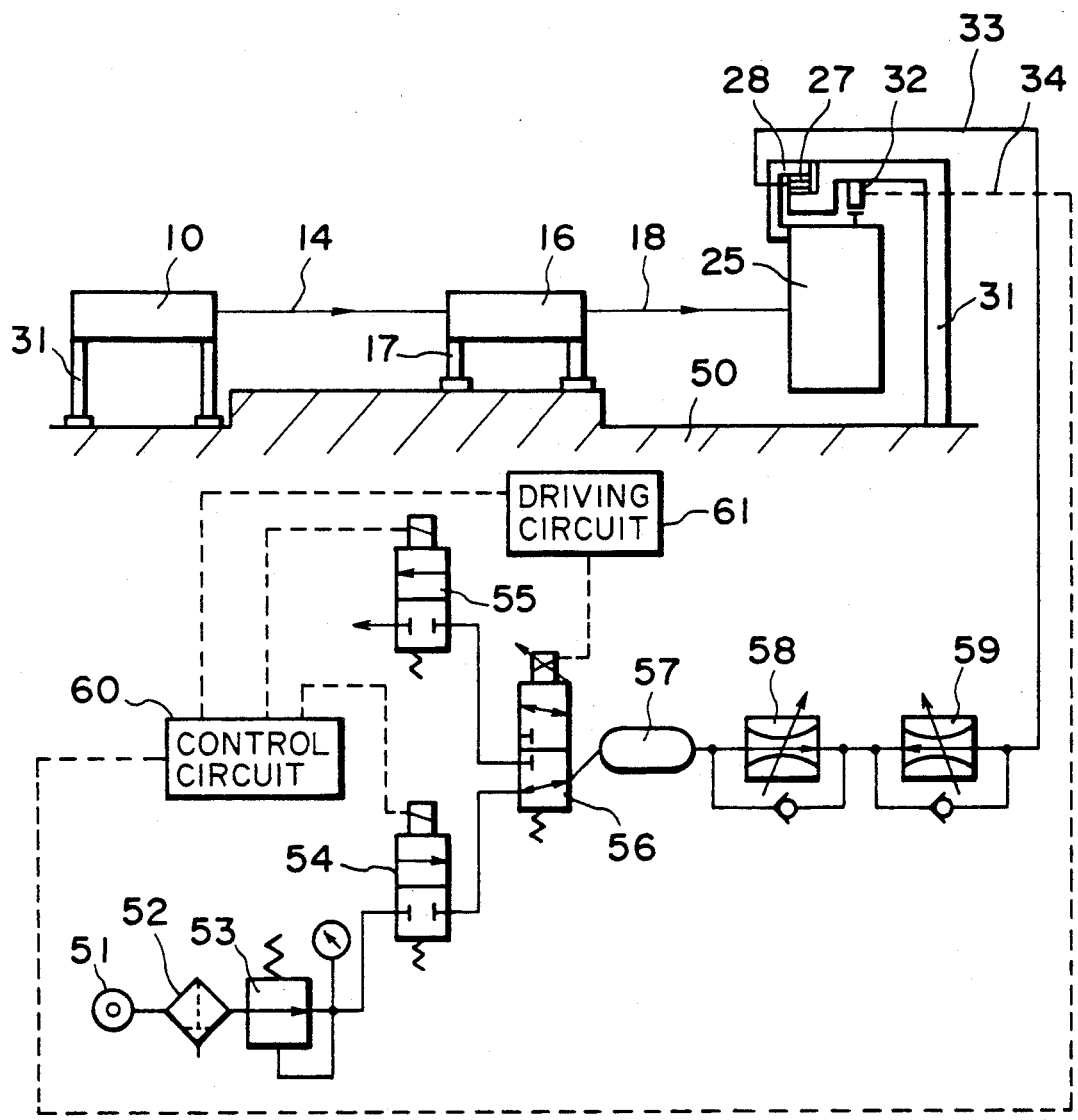
FIG. 2 is a schematic view for explaining the structure of a control system of the exposure apparatus of the FIG. 1 embodiment.

FIG. 1 shows a general structure of a SOR X-ray exposure apparatus according to an embodiment of the present invention, and FIG. 2 shows one system (of three systems of the same structure) of an attitude controlling pneumatic and electric circuit of an anti-vibration mechanism. Hereinafter, a substantially vertical direction will be referred to as the "Y direction", a direction substantially parallel to the projection of SOR X-ray, projected substantially horizontally, will be referred to as "Z direction", and a direction perpendicular to the Y-Z plane will be referred to as the "X direction".

Denoted in FIG. 1 denoted at 10 is a SOR device; at 11 is an accumulation ring for accumulating electrons injected from an accelerator (not shown); denoted at 12 are bending magnets; at 13 are SOR bases; denoted at 14 is orbit radiation light (SOR light). Denoted at 15 is cylindrical X-ray reflection mirror for shaping the SOR light 14 into the size of the exposure view angle; denoted at 16 is an ultra-high vacuum mirror chamber maintained at a vacuum of $10^{31}$ $10$ to $10^{-12}$ (Torr); denoted at 17 are X-ray mirror bases; denoted and at 18 is a shaped exposure beam traveling through an ultra-high vacuum beam line (not shown), including the chamber 16. Denoted at 20 is a main assembly of the exposure apparatus; denoted at 21 is an X-ray mask on which a fine circuit pattern is formed; denoted at 22 is an alignment unit for alignment of the X-ray mask 21 with a wafer; and denoted at 23 are four sets of alignment optical systems for photoelectrically detecting alignment marks of the mask 21 and the wafer to measure any positional deviation of the mask and the wafer with respect to the X and Y directions. Denoted at 24 is a main frame for supporting an exposure stage 100 (see FIG. 3); denoted at 25 is a reduced-pressure chamber for maintaining an exposure ambience of a reduced-pressure helium ambience (of a pressure of 100–200 (Torr)); and denoted at 26 is a vacuum chamber having a correction unit (shutter means) for compensating for a luminance distribution of an illumination system as well as a beryllium window which provides a partition between the ultra-high vacuum beam line at the mirror chamber 16 side and the reduced-pressure chamber 25. The shutter means may be of a known type such as disclosed in Japanese Laid-Open Patent Application 1-243519. Denoted at 27 are anti-vibration units comprising air spring means (see FIG. 2); and denoted at 28 are depending plates with which the reduced-pressure chamber 25 is carried on the anti-vibration units 27. In this example, three sets of anti-vibration units 27 are disposed at different positions on the X-Z plane. Denoted at 29 is an anti-vibration base; denoted at 31 are $\Delta y$-adjusting cylinders for adjusting the height of the exposure apparatus main assembly 20 as a whole; and denoted at 32 are distance measuring sensors for measuring relative displacement $\Delta y$, in the Y direction, between the base 30 and the anti-vibration base 28. In this example, three distance measuring sensors are provided, like the anti-vibration units 27. Denoted at 33 is a gas supplying/discharging system; denoted at 34 are control signal lines; and at 35 are air-flyers provided for the transportation of the apparatus. Denoted at 36 are $\omega_Y$-actuating air springs effective to rotationally move, by a small amount, the exposure apparatus main assembly 20 as a whole about the Y axis; denoted at 37 are supporting plates; denoted and at 38 is a $\omega_Y$-actuating rod.

In FIG. 2, denoted at 50 is a floor on which the exposure apparatus is placed. More particularly, the bases 13, 17 and 31 of the SOR device 10, the mirror chamber 16 and the like are supported on this floor 50. Denoted at 51 is an air source from which an air is supplied to an air filter 52, a regulator 53, a supplying solenoid valve 54, an electopneumatic proportioning valve 56, a surge tank 57, a supplying speed controller 58, a discharging speed controller 59 and to the anti-vibration unit 27, in this order. Denoted at 55 is a discharging solenoid valve. Denoted at 60 is a control circuit and denoted at 61 is a driving circuit, which serve to control the opening/closing of the valves 54, 55 and 56 in response to measurement by the sensor 32 to control the quantity of air supply to the anti-vibration unit 27. With similar control of the air supply to all the three anti-vibration units 27, it is possible to control the position of the chamber 25 with respect to each of the Y, $\omega_Z$ and $\omega_X$ directions or the attitude of the chamber 25.

Figure 3:
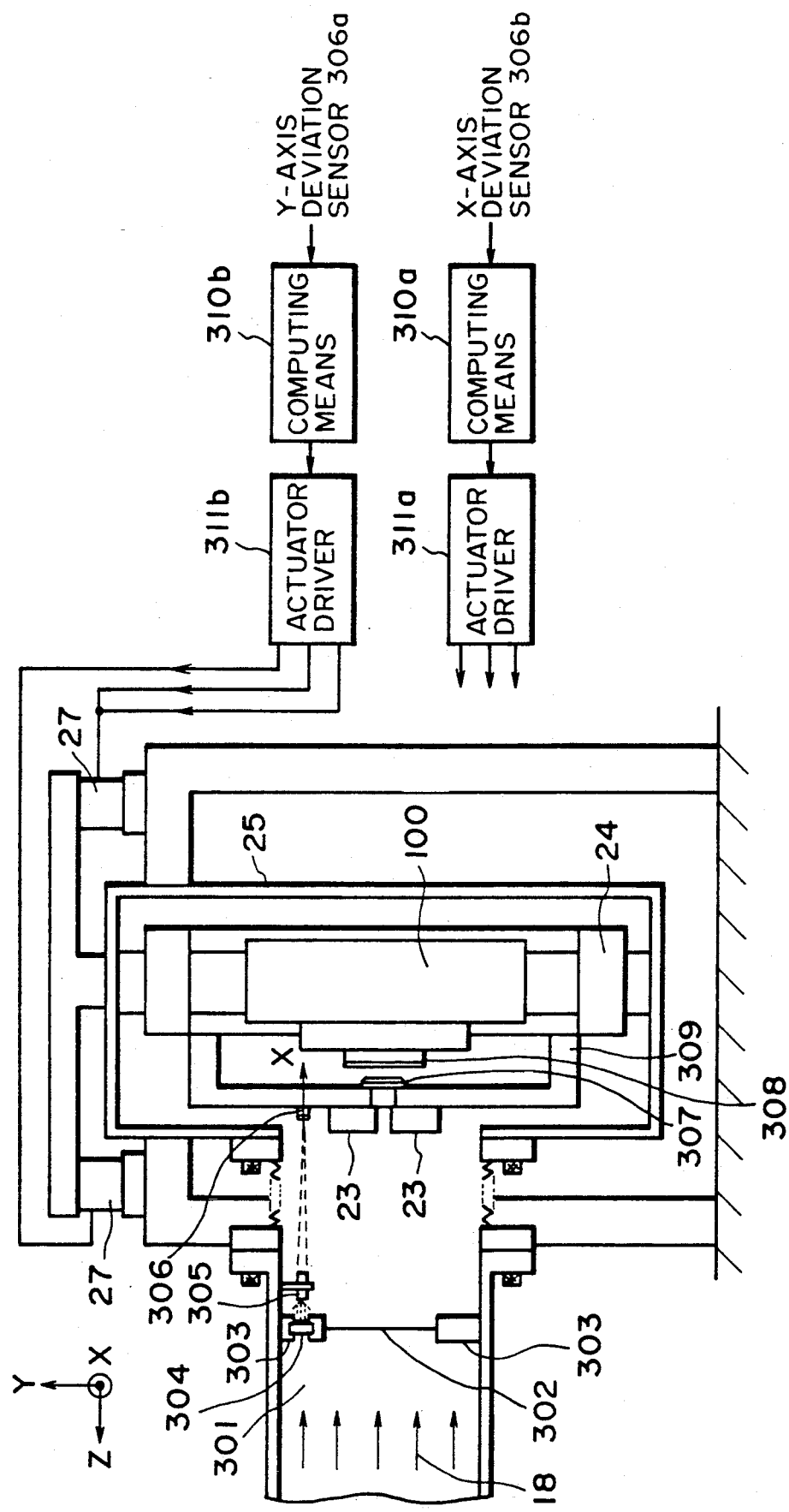
FIG. 3 is a side sectional view, showing the structure of a main assembly of the exposure apparatus of the FIG. 1 embodiment.
Figure 4:
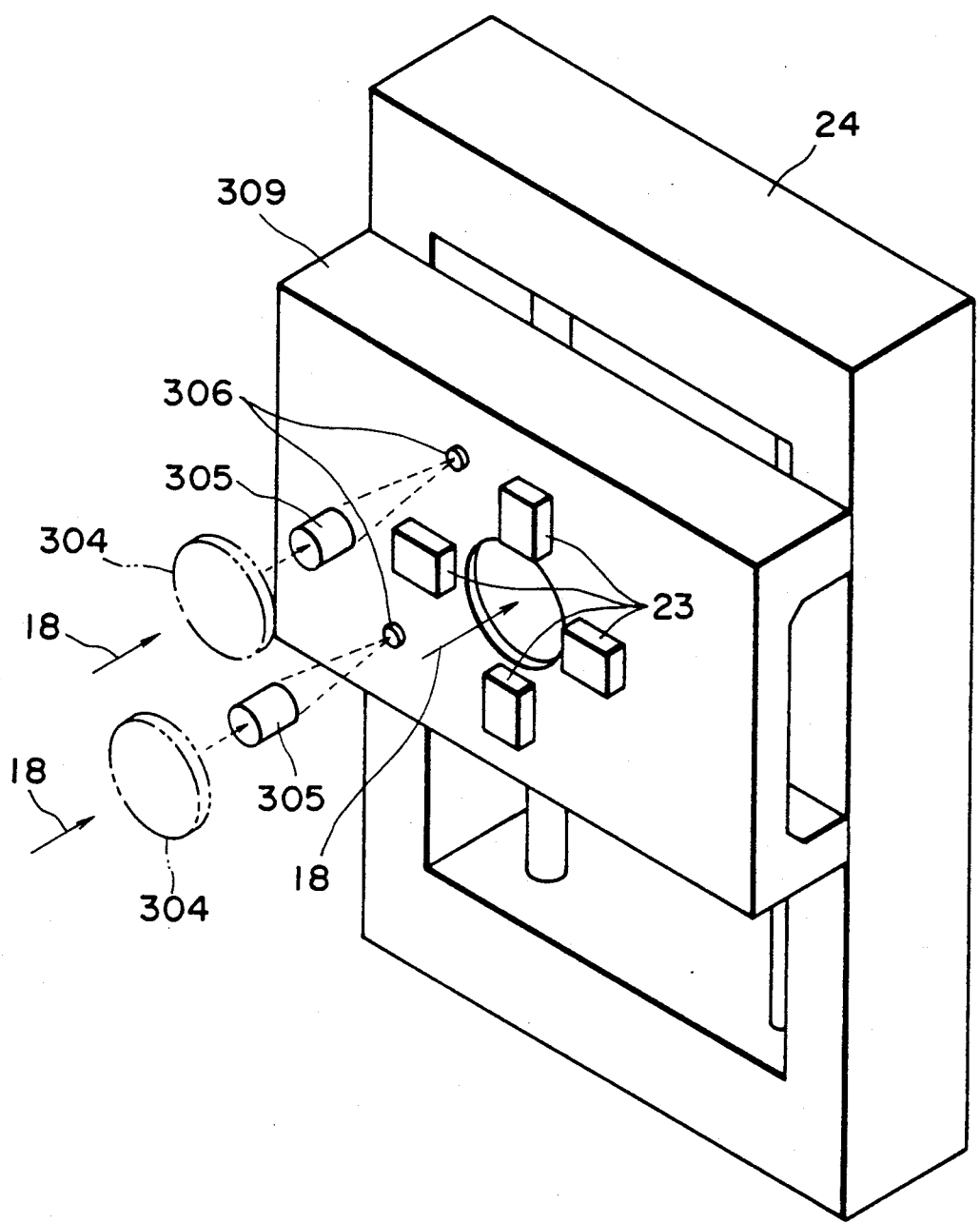
FIG. 4 is a perspective view of a major part of the FIG. 3 structure.

FIG. 3 is a sectional side view of the exposure apparatus main assembly 20 of FIG. 1, and FIG. 4 is a perspective view of a portion including the alignment unit 22 and the main frame 24. Denoted in FIG. 3 at 301 is a beam port to which the SOR beam 18 divergently emanating from the X-ray mirror (surface light source for exposure) 15 is inputted. Denoted at 302 is a beryllium window (beryllium film) for isolating the ultra-high vacuum at the beam port 301 side and the reduced-pressure helium ambience at the reduced-pressure chamber 25 side, from each other. Denoted at 303 is a support frame for the beryllium window 302. Denoted at 304 are $SiO_2$ glass filters provided in openings formed in the beryllium supporting frame 303, respectively. Each glass filter 304 is effective to absorb X-rays contained in the SOR beam 18 but to transmit light of longer wavelengths, not shorter than visible light. Denoted at 305 are visible light optical systems each for collecting, at its focal point, a visible parallel light passing through corresponding one of the glass filters 304. Denoted at 306 are two-dimensional area sensors (optical detection means) each for detecting the visible light focused by corresponding one of the optical systems 305. Each two-dimensional area sensor 306 is disposed on the focal plane of corresponding one of the optical systems 305, with no positional deviation relative to a mask 307 and a wafer 308. More particularly, the sensors 306 are disposed on an alignment frame 309, as shown in FIG. 4, which is fixed to the main frame 24. As best seen in FIG. 4, two separate systems are provided for detection of the X-direction deviation and the Y-direction deviation of the SOR beam 18, each system comprising one glass filter 304, one visible light optical system 305 and one two-dimensional area sensor 306. Denoted at 310a and 310b are computing devices for detecting translational deviations $\Delta x$ and $\Delta y$ or rotational deviations $\Delta\omega_X$ and $\Delta\omega_Y$ about the Y axis of the SOR beam 18 relative to the mask 307 and the wafer 308, on the basis of outputs of the sensors 306. Denoted at 311a and 311b are actuator drivers for driving the actuators 27, 31 and 36 for correction of these deviations.

Figure 5:
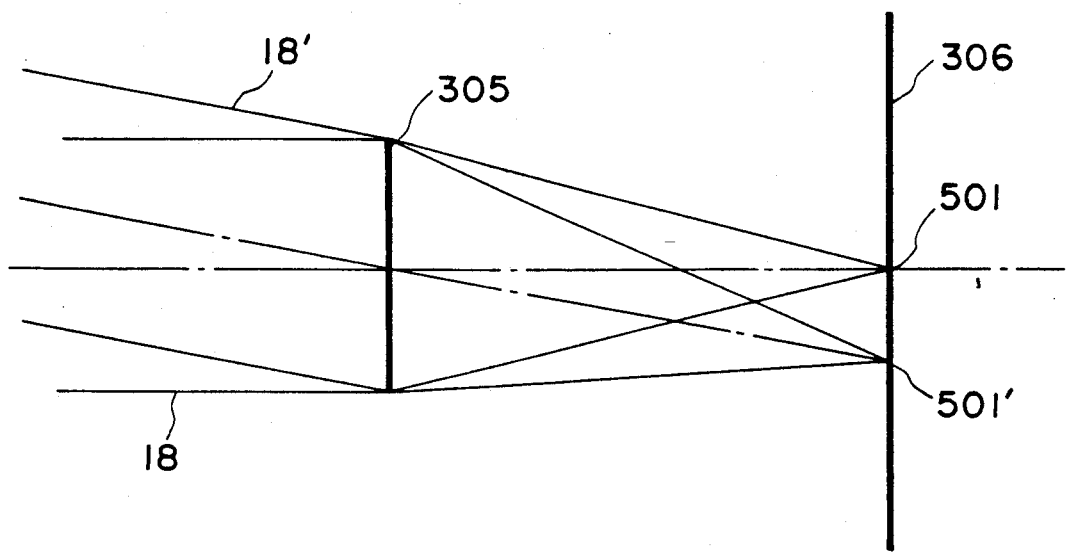
FIG. 5 is a schematic view, for explaining attitude direction in the structure of FIG. 3.

If in the structure described above the angle of incidence of the SOR beam 18 with respect to an exposure system accommodating the mask 307 and the wafer 308 changes relatively, such as depicted at 18' in FIG. 5, with a change in attitude of the exposure system or with a change in path of the SOR beam 18, then the position of the light spot focused by the lens 305 displaces from a point 501 to a point 501'. The computing devices 310 calculate rotational deviations $\Delta\omega_X$ and $\Delta\omega_Y$ on the basis of light spot position signals (differential signals) from the two-dimensional area sensors 306, and supply to the actuator drivers 311 those signals representing the drive quantities of the actuators 27, 31 and 36. In response, the actuators 27, 31 and 36 are driven to control the attitude of the exposure apparatus main assembly 20 so as to correct the rotational deviations $\Delta\omega_X$ and $\Delta\omega_Y$.

Figure 6:
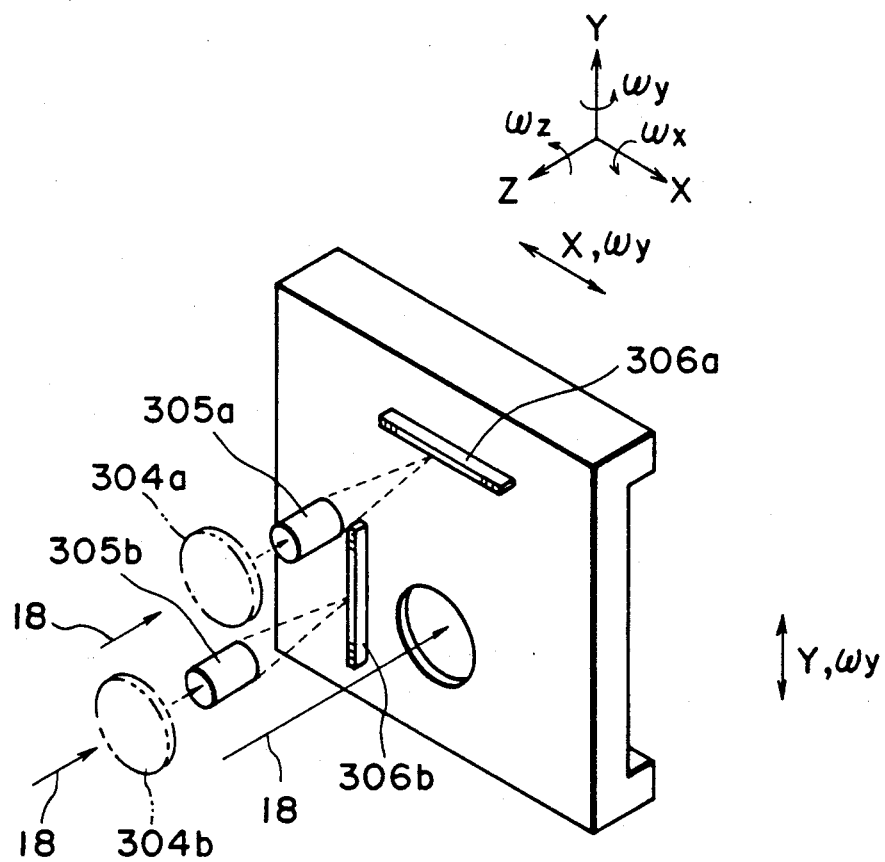

FIG. 6 shows an example wherein, as the optical detection means 306, line sensors are used in place of the two-dimensional area sensors 306a and 306b in FIG. 4. In this example, the line sensor 306a serves to detect rotational deviation $\Delta\omega_Y$ about the Y axis, and the line sensor 306b serves to detect a rotational deviation $\Delta\omega_X$ about the X axis. In place of detecting a rotational deviation, a translational deviation $\Delta x$ in the X direction and a translational deviation $\Delta y$ in the Y direction may be detected.

Figure 7:
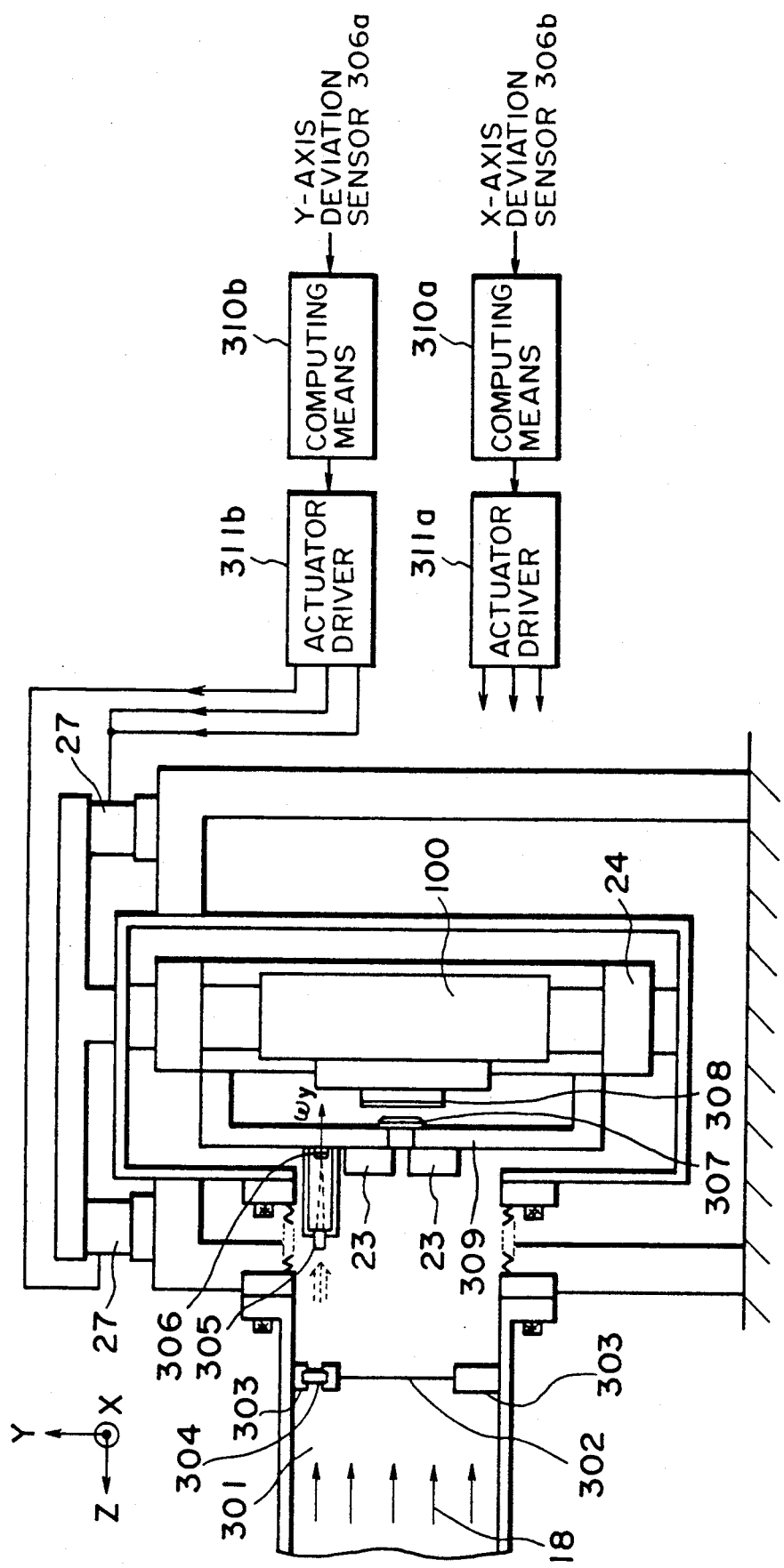
Figure 8A:
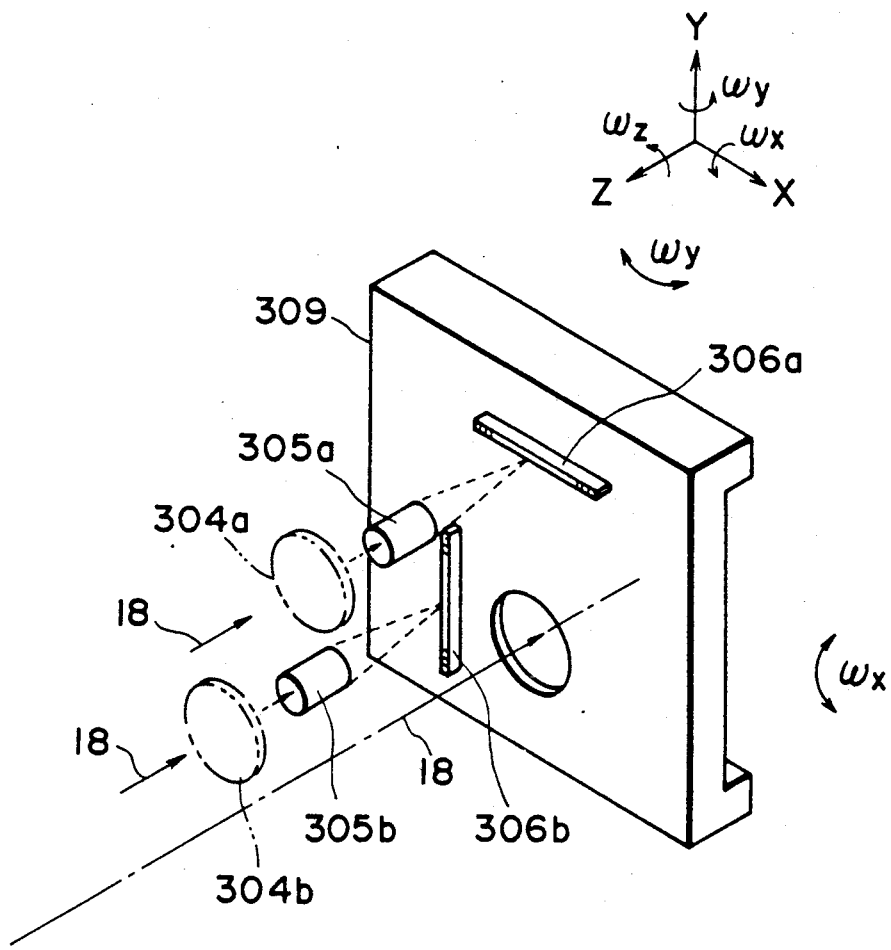
Figure 8B:
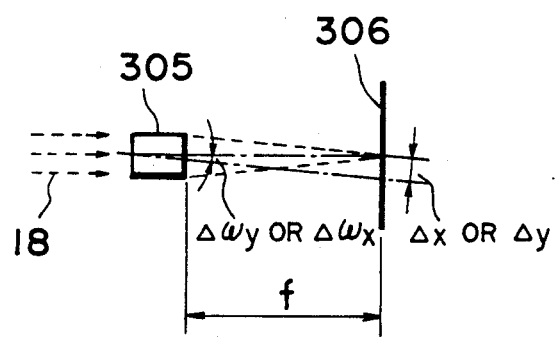

FIG. 7 shows an example wherein the visible light optical system 305, which in FIG. 3 is fixed to the beam port 301 side, is fixed to the alignment frame 309 side. FIG. 8A shows an example wherein line sensors 306a and 306b are used as the optical detection means 306b shown in FIG. 7. Where the visible light optical system 305 is fixed to the alignment frame 309 side, like this example, as seen from FIG. 8B it is possible to detect rotational deviations $\Delta\omega_X$ and $\Delta\omega_Y$ of the SOR beam 18 relative to the mask 307 and the wafer 308 about the X and Y axes, as those converted into translational deviations $\Delta y$ and $\Delta x$ in the Y and X directions, respectively.

Figure 9:
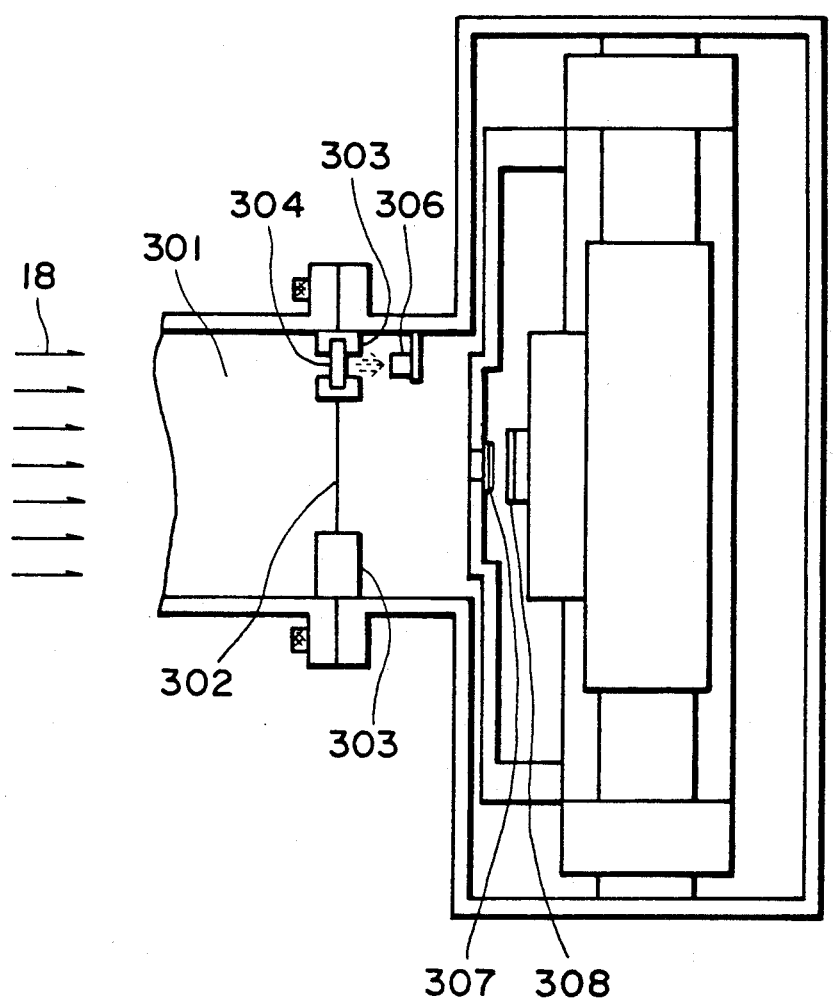

FIG. 9 shows an example with a structure for detecting a change in intensity of the SOR X-ray. As the optical detection means 306 of FIG. 3, a device which serves to convert an integrated light intensity throughout its light receiving surface into an output voltage, such as a photodiode, for example, is used. In this example, the position of the light spot is not detected. For this reason, it is not always necessary to dispose the detection surface of the photodiode 306 on the focal plane of the visible light optical system 305. Accordingly, in this embodiment, the visible light optical system 305 is omitted. The signal from the photodiode 306 corresponding to the light intensity may be used for measurement of an illuminance distribution on a wafer, for control of exposure of a wafer or for adjustment of the the intensity of X-rays.

In the preceding embodiments, visible light passing through the glass filter 304 provided in the opening of the support frame 302 is detected. However, a different light such as infrared rays may be detected. Similarly, an opening with a membrane may be formed in the support frame 302 and X-rays passing therethrough may be detected.

In the preceding embodiments, an opening is formed in the support frame 302 and a glass filter 304 is provided thereat. However, an opening with a membrane may be formed in the support frame 302 and, on the other hand, a $SiO_2$ glass filter may be provided in front of the sensor, such that a beam from the opening may be received by the sensor through the filter.

Figure 10:
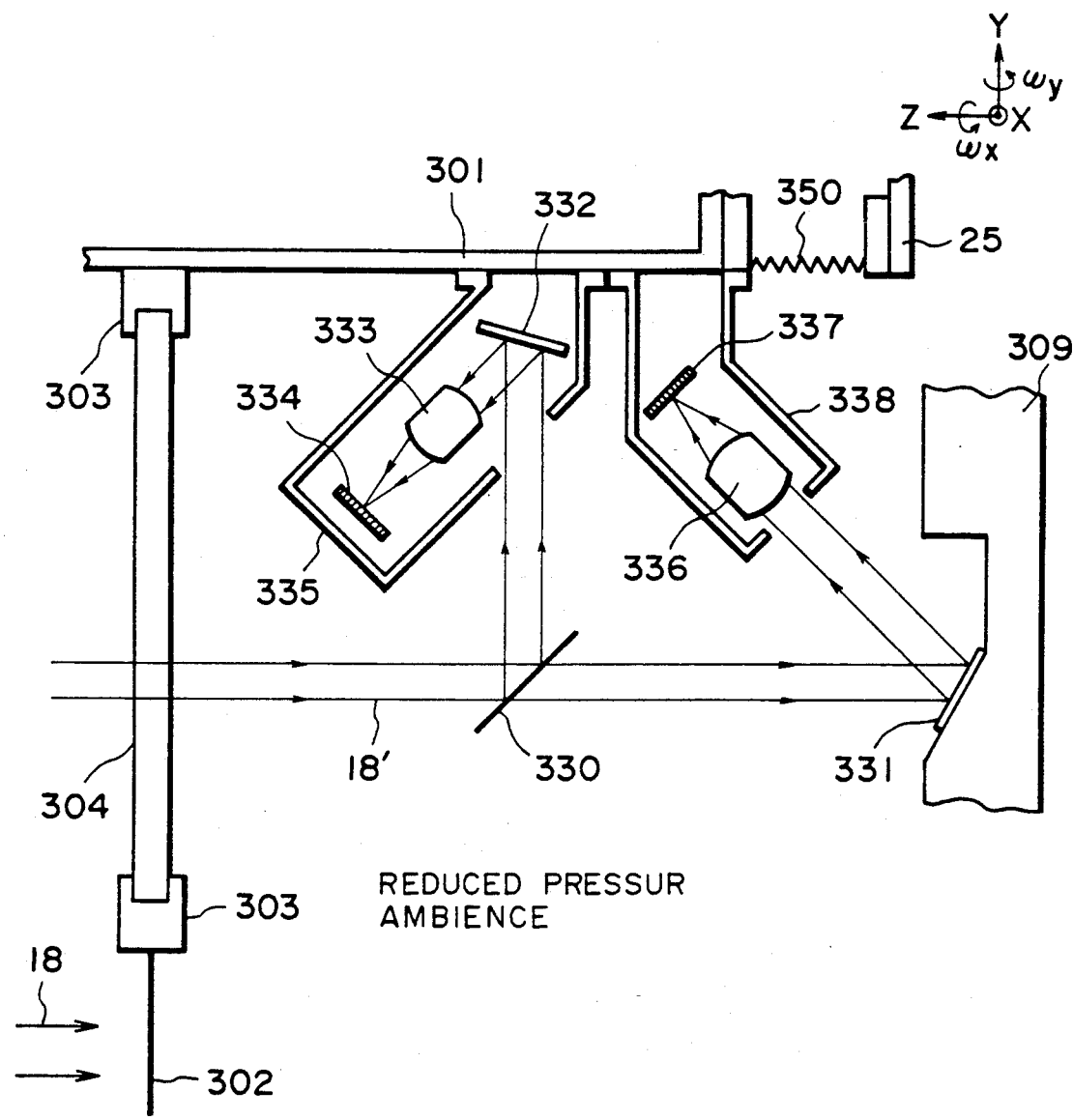

FIG. 10 shows another embodiment of detecting device for detecting rotational components $\omega_X$ and $\omega_Y$ about the X axis and the Y axis, respectively. Where the photoelectric detecting means 306 shown in FIGS. 3 and 4 are arranged to detect shifts in the X and Y directions, the detecting device of this embodiment may be added to detect the rotational components $\omega_X$ and $\omega_Y$.

Denoted in FIG. 10 at 330 is a half mirror which is fixed to the beam port 301. The half mirror 330 serves to reflect, in the Y direction, a portion of visible light 18' of the SOR light 18, passing through a glass filter 304. The glass filter 304 may be the same as the glass filter 304 in FIGS. 3 and 4 for the photoelectric detection means 306 or, alternatively, it may be separate from the glass filter of FIGS. 3 and 4.

Denoted at 332 is a reflection mirror for inputting the visible light 18', reflected by the half mirror 330, into an imaging optical system 333. Denoted at 334 is a two-dimensional area sensor such as a CCD, for example, for detecting a change in the position of a spot of the visible light 18' as formed by the imaging optical system 333. The sensor 334 has a light receiving surface which is disposed substantially perpendicular to the optical axis of the imaging optical system 333. Also, the light receiving surface of the sensor is disposed at a focal point position of the imaging optical system 333. Denoted at 335 is a barrel for supporting the reflection mirror 332, the imaging optical system 333 and the sensor 334 in the illustrated relationship and for fixing them to the beam port 301 as a unit.

With this arrangement, any inclination of the visible light 18' relative to the beam port 301 in the $\omega_X$ or $\omega_Y$ direction causes displacement of the light spot on the light receiving surface of the sensor 334, formed by the imaging optical system 333. Thus, by measuring the displacement on the basis of the output of the sensor 334, it is possible to determine the inclination of the visible light 18', namely, the inclination of the SOR light 18, relative to the beam port 301. Also, the direction of displacement of the light spot is different in dependence upon the direction of inclination ($\omega_X$ or $\omega_Y$) of the visible light 18' relative to the beam port 301. Therefore, it is possible to detect inclinations $\omega_X$ and $\omega_Y$ independently of each other. Further, in this embodiment, the light spot is formed by the visible light 18' having been selected by the half mirror 330. As a result, any translational displacement of the visible light 18' relative to the beam port 301 in the X or Y direction does not cause displacement of the light spot on the light receiving surface of the sensor 334 as formed by the imaging optical system 333. Namely, with this structure, only inclinations $\omega_X$ and $\omega_Y$ can be measured.

Denoted in FIG. 10 at 331 is a reflection mirror which is fixed at a recessed portion of an alignment unit 309, with inclination in the $\omega_X$ direction. The reflection mirror 331 serves to reflect, in a direction as illustrated, a portion of the visible light 18' passing through the half mirror 330 and serves to input the same into an imaging optical system 336. Denoted at 337 is a two-dimensional area sensor such as a CCD, for example, for detecting a change in position of a spot of the visible light 18' as formed by the imaging optical system 336. The sensor 337 has a light receiving surface which is set substantially perpendicularly to the optical axis of the imaging optical system 336. Also, the light receiving surface of the sensor 337 is disposed at a focal point position of the imaging optical system 336. Denoted at 338 is a barrel for supporting the imaging optical system 336 and the sensor 337 in an illustrated relationship and for fixing them to the beam port 301 as a unit.

With this arrangement, any inclination of the visible light 18' and/or the alignment unit 309 relative to the beam port 301 in the $\omega_X$ or $\omega_Y$ direction causes displacement of the light spot on the light receiving surface of the sensor 337 as formed by the imaging optical system 336. Thus, by measuring the displacement on the basis of the output of the sensor 337, it is possible to determine combined inclination, that is, a combination of inclination of the visible light 18' (SOR light 18) relative to the beam port 301 and inclination of the alignment unit 309 relative to the beam port 301. Also, the direction of displacement of the light spot is different in dependence upon the direction of inclination ($\omega_X$ or $\omega_Y$) of the visible light 18' and/or the alignment unit 309 relative to the beam port 301. Therefore, it is possible to detect inclinations $\omega_X$ and $\omega_Y$ independently of each other.

It is to be noted here that the inclination of the alignment unit 309 itself relative to the beam port 301 can be detected independently, from a difference between the inclination as determined on the basis of the output of the sensor 337 and the inclination as determined on the basis of the output of the sensor 334. Further, any inclination $\omega_X$ or $\omega_Y$ of the alignment unit 309 relative to the visible light 18' can be detected from a difference between inclination $\omega_X$ or $\omega_Y$ of the visible light 18' relative to the beam port 301 and inclination $\omega_X$ or $\omega_Y$ of the alignment unit 309 relative to the beam port 301.

Correction of the thus detected inclination is such that inclination $\omega_X$ can be corrected by controlling the air supply to the three anti-vibration units 27 (FIG. 1), while inclination $\omega_Y$ can be corrected by controlling air supply to the two the air springs 36 (FIG. 1).

Also in this embodiment, since the light spot is formed by the visible light 18' selected by the half mirror 330, translational displacement of the visible light 18' relative to the beam spot 301 in the X or Y direction does not cause displacement of the light spot on the light receiving surface of the sensor 334 as formed by the imaging optical system 333. Therefore, with this structure, only inclinations $\omega_X$ and $\omega_Y$ can be measured.

In this embodiment, like the foregoing embodiments, the vacuum chamber 25 is flexibly coupled to the beam port 301 by means of a coupling member 350 so that it is displaceable relative to the beam port 301. Also, the remaining portion of this embodiment is substantially the same as the foregoing embodiments.

FIG. 11 shows another embodiment of detecting device for detecting rotational components $\omega_X$ and $\omega_Y$ about the X axis and the Y axis, respectively. In this embodiment, three glass filters 304 are provided at different positions with respect to the X-Y plane. These glass filters 304 are fixed to a support frame such as at 303 in FIG. 3.

Behind each glass filter 304, there are provided an imaging lens 305, a reflection mirror 340, another reflection mirror 341 and a line sensor 342, in an order of the advancement of visible light 18'. The imaging lenses 305, the reflection mirrors 341 and the line sensors 342 are fixedly supported by the beam port 301 as a unit. Also, the reflection mirrors 340 are fixedly supported by the alignment unit 309 at different positions with respect to the X-Y plane. Each imaging lens 305 is disposed so as to bring the reflection surface of the associated reflection mirror 340 and the light receiving surface of the associated line sensor 342 into an optically conjugate interrelationship as the alignment unit 309 is held in a desired attitude relative to the visible light 18' with respect to the $\omega_X$ and $\omega_Y$ directions.

The visible light 18' passing through the glass filter 304 goes through a portion of a pupil of the imaging lens 305 and is reflected by the reflection mirror 340. After this, again the light goes through another portion of the pupil of the imaging lens 305 and is reflected by the reflection mirror 341. The visible light 18' reflected by the reflection mirror 341 forms a spot of light upon the light receiving surface of the line sensor 342. Since the abovedescribed optical system constitutes what can be called a "pupil division type autofocusing system", if the alignment unit 309 inclined with the main frame 24 in the $\omega_X$ or $\omega_Y$ direction and, as a result, the position of the reflection mirror 340 with respect to the Z direction shifts from the desired position as described, then the light spot formed on the light receiving surface of the line sensor 342 displaces on this surface along the Z axis. The quantity of displacement of the light spot corresponds to the quantity of shift of the reflection mirror 340, and the direction of displacement corresponds to the direction of shift of the reflection mirror 340 along the Z axis Accordingly, with this structure, by detecting the quantity and direction of shift of each reflection mirror 340 from a desired position, along the Z axis, on the basis of the outputs of the three line sensors 342, it is possible to determine any inclination of the plane that contains the reflection mirrors 340, namely, any inclination of the alignment unit 309 relative to the visible light 18' (i.e. SOR light 18) with respect to the $\omega_X$ and $\omega_Y$ directions. Correction of the thus detected inclination is such that the inclination $\omega_X$ can be corrected by controlling the air supply to the three anti-vibration units 27 (FIG. 1), while the inclination $\omega_Y$ can be corrected by controlling the air supply to the two air springs 36 (FIG. 1).

Further, since in this embodiment each reflection mirror 340 comprises a flat mirror, any translational displacement between the visible light 18' and the alignment unit 309 in the X or Y direction does not cause displacement of the light spot on the light receiving surface of the sensor 342 as formed by the imaging lens 305. Therefore, with this structure, only inclinations $\omega_X$ and $\omega_Y$ can be measured.

Figure 12B:
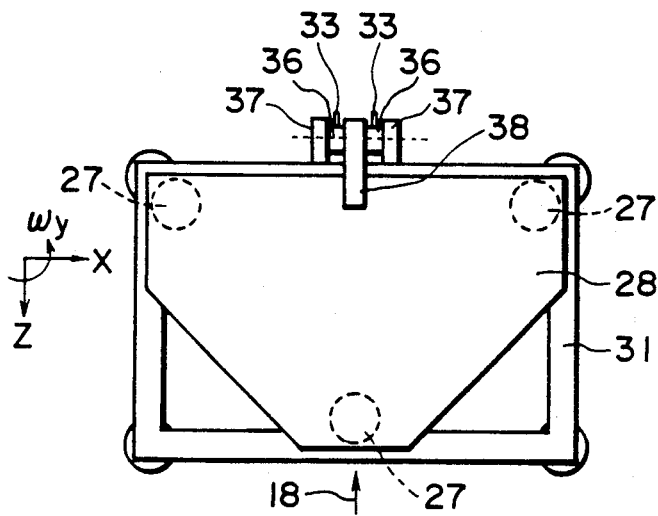
FIGS. 12A–12C are a front view, a top plan view and a side view, respectively, showing the structure of a main assembly of the exposure apparatus of the FIG. 1 embodiment.
Figures 12A, 12C:
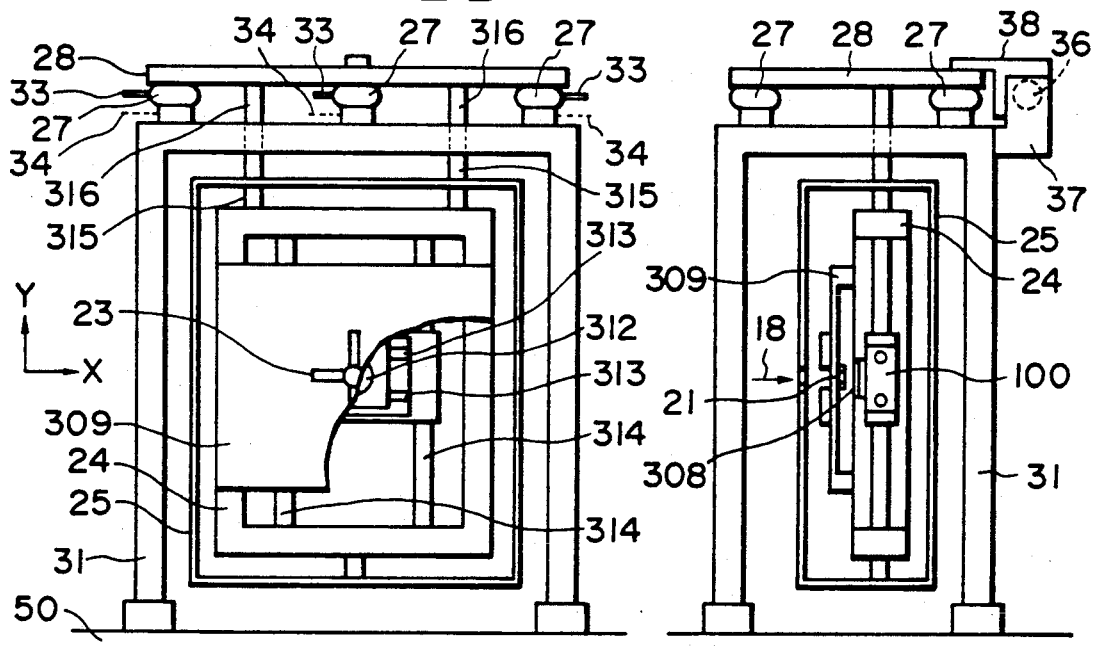

FIGS. 12A–12C are a front view, a top plan view and a side view, respectively, showing the structure of the exposure apparatus main assembly 20 of FIG. 1. Denoted in these drawings at 308 is a wafer onto which an image of a mask 21 is to be transferred. Denoted at 312 is a wafer chuck for holding the wafer 308 thereon; denoted at 313 are X-axis guides for guiding movement of the wafer chuck 312 along the X axis; denoted at 314 are Y-axis guides for guiding movement of the wafer chuck 312 along the Y axis; denoted at 315 are main frame supporting members by which the main frame 24 are supported on the chamber 25; and denoted at 316 are chamber supporting members by which the chamber 25 is supported on the base 31.

In this structure, between the depending plate 28 and three anti-vibration units (air spring means) 27, a freedom in the $\omega_Y$ direction (rotational component about the Y axis) is provided. Also, at the opposite sides of the rod 38 with respect to the X direction, which rod is fixed to the plate 28, two air springs 33 are disposed. Thus, by controlling the air to be supplied to these air springs 33, it is possible to rotationally displace, relative to the anti-vibration base 31 by a small amount and in the $\omega_Y$ direction about the Y axis, a combination of the plate 28, the main frame 24 (depending from the plate 28 through the supporting members 316, the chamber 25 and the supporting members 315) and the alignment unit 309 (supported by the main frame 24), as a unit. This makes it possible to correct any rotational deviation $\Delta\omega_Y$, about the Y axis, of the optical axis of alignment light from each alignment optical system 23 provided on the alignment unit 22, relative to the Z axis. Namely, it is possible to bring the optical axis of the alignment light into a substantially parallel relationship or a predetermined relationship with the Z axis (i.e. the direction of projection of the SOR light). After this is accomplished, a mask 307 and a wafer 308 (FIG. 3) are introduced into and held in the exposure apparatus main assembly 20, and any positional deviation of the mask and the wafer is measured by using the alignment optical systems 23. The measured positional deviation is corrected by moving the wafer stage 100, for example. After this mask-to-wafer alignment, the shutter means of the unit 26 in FIG. 1 is controlled to execute exposure of the wafer 308 to the mask 307 with the SOR light 18, whereby a pattern of the mask 307 is printed on the wafer 308. It is to be noted here that the correction of inclination $\omega y$ may be made after the mask 307 and the wafer 308 are introduced into the exposure apparatus main assembly 20.

Referring to FIGS. 13A to 17, some embodiments of the rotation actuator for rotationally displacing ($\omega y$ rotation), by a small amount, the alignment unit 22 about the Y axis will be explained.

Figure 13A:
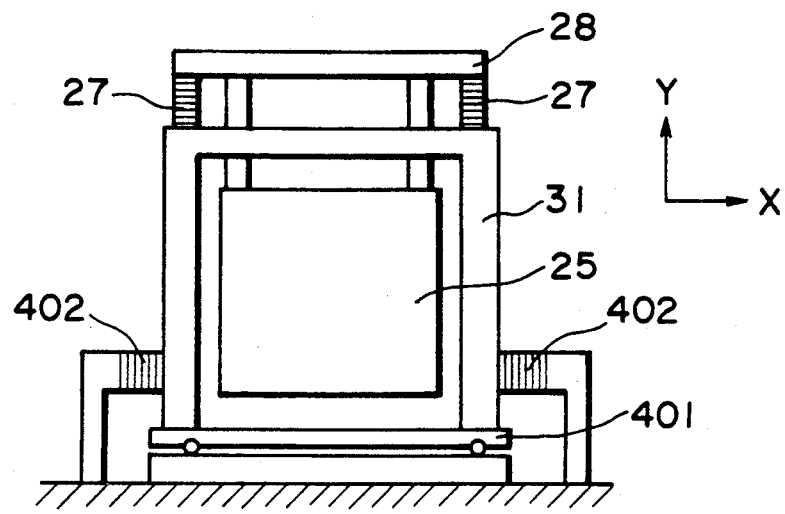
FIGS. 13*1*–17 are schematic representations, respectively, showing modified forms of the FIG. 1 embodiment.
Figure 13B:
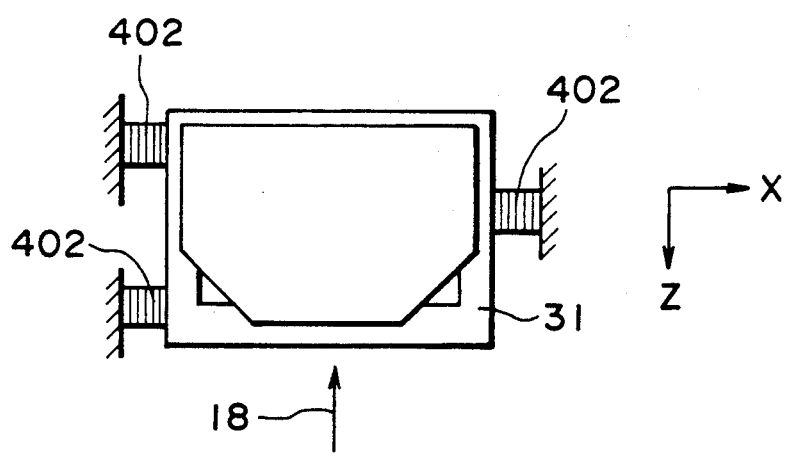
Figure 14:
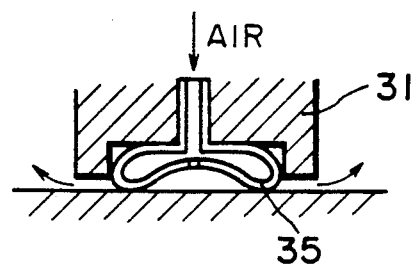

FIGS. 13A and 13B show an embodiment wherein a $\omega y$-stage 401 is provided between the floor 50 and the anti-vibration base 31, wherein the exposure apparatus may assembly 20 is placed on the $\omega y$-stage 401, and wherein three air spring means 402 for actuating the exposure apparatus main assembly 20 in the X-Z plane are provided. As the bearing means of this $\omega y$-stage 401, the air bearing means (air flyers 35), shown in FIG. 14 and provided for transportation of the exposure apparatus main assembly 20, may be used.

Figure 15A:
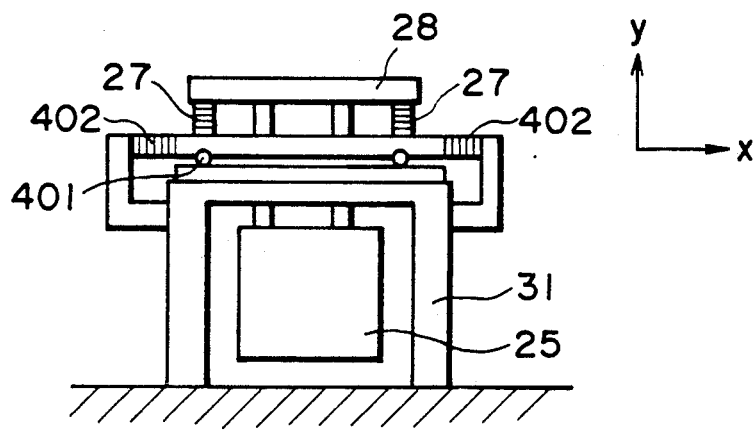
Figure 15B:
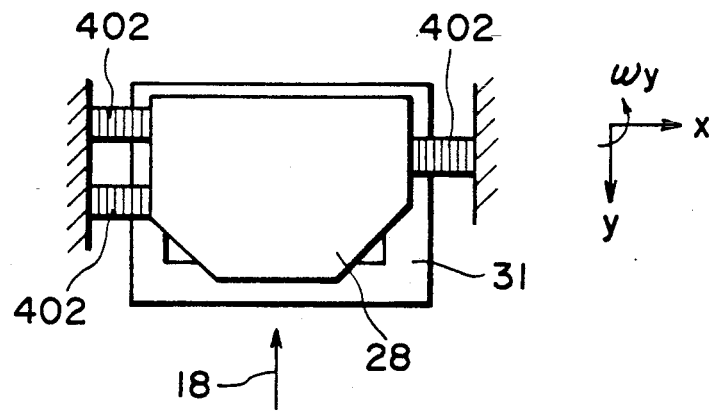

FIGS. 15A and 15B show an embodiment wherein a $\omega y$-stage 401 is provided between the anti-vibration base 31 and the anti-vibration units (air spring means) 27, and wherein three air springs 402 for actuating the $\omega y$-stage 401 are provided, such that the reduced-pressure chamber 25 can be rotationally displaced in the $\omega y$ direction together with the depending plate 28 and the anti-vibration units 27.

Figure 16A:
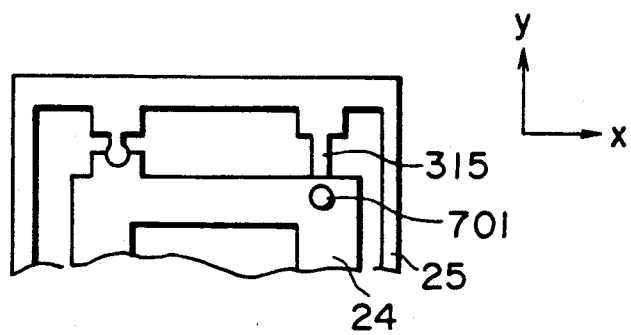
Figure 16B:
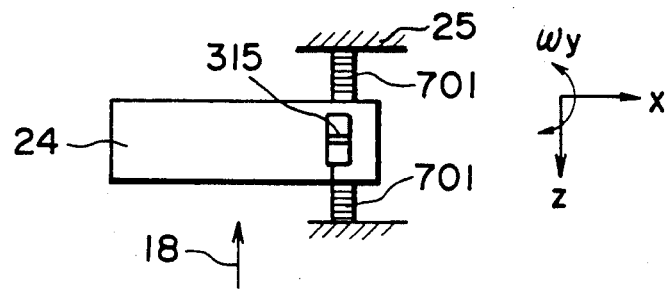

FIGS. 16A and 16B show an embodiment wherein the main frame supporting means 315 is equipped with a freedom in the $\omega y$ direction, and wherein two actuators 701 for displacing the main frame 24 relative to the wall of the reduced-pressure chamber 25 in the X-Z plane and along the Z axis, are provided such that the main frame 24 can be rotationally displaced relative to the reduced-pressure chamber 25 in the $\omega y$ direction.

Figure 17:
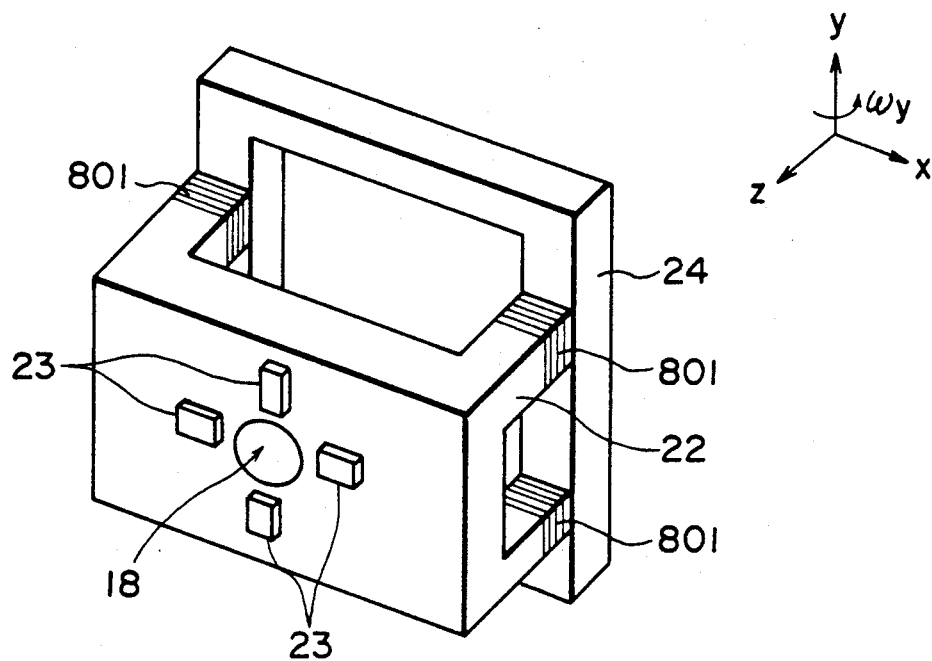

FIG. 17 shows an embodiment wherein the coupling portion between the alignment frame 22 and the main frame 24 is equipped with freedom in the $\omega y$ direction, and wherein four actuators 801 for displacing the alignment frame 22 relative to the main frame 24 at least in the X-Z plane and along the Z axis, are provided such that the alignment frame 22 can be rotationally displaced relative to the main frame 24 in the $\omega y$ direction.

The present invention is not limited to the forms of the above-described embodiments, and the present invention can be embodied in many modifications. As an example, the supporting portion of the alignment scope (alignment optical system) 23 may be equipped with freedom in the $\omega y$ direction, such that only the alignment scope 23 is allowed to be displaced relative to the alignment frame 22 in the X-Z plane. Alternatively, a mechanism may be provided so as to shift the optical axis of the alignment scope 23 itself in the $\Omega y$ direction.

While the invention has been described with reference to the structures disclosed herein, it is not confined to the details set forth and this application is intended to cover such modifications or changes as may come within the purposes of the improvements or the scope of the following claims.

What is claimed is:

1. A method of manufacture of semiconductor devices comprising the steps of:
   projecting a radiation beam comprising first and second beams from a synchrotron orbit radiation source into an ambience maintained substantially at a vacuum;
   directing the first beam, to a wafer through a window effective to isolate the ambience to thereby print a circuit pattern on an X-ray sensitive layer on the wafer with the first beam;
   providing a support for the window having an opening at least in a portion thereof;
   extracting the second beam through the opening; and
   detecting and correcting any deviation of the first beam with respect to the wafer using the second beam.

2. A method according to claim 1, further comprising the steps of focusing the second beam on a sensor such that the sensor produces a signal corresponding to the position of incidence of the second beam upon the sensor; and detecting the deviation of the first beam with respect to the wafer on the basis of the signal.

3. A method according to claim 2, wherein the second beam contains visible light and the opening is defined by a glass material effective to absorb X-rays but to transmit visible light, wherein said method further comprises the step of transmitting visible light of the second beam through the glass material of the opening.

4. A method of manufacturing semiconductor devices comprising the steps of:
   projecting a radiation beam comprising first and second beams from a synchrotron orbit radiation source into an ambience maintained substantially at a vacuum;
   directing the first beam to a wafer through a window effective to isolate the ambience to thereby print a circuit pattern on an X-ray sensitive layer on the wafer with the first beam;
   providing a support for supporting the window having an opening at least in a portion thereof;
   extracting the second beam through the opening; and
   detecting an intensity of the first beam on the basis of an intensity of the second beam.

5. A method according to claim 4, further comprising the steps of: directing the second beam to a sensor such that the sensor produces a signal corresponding to the intensity of the second beam; and detecting the intensity of the first beam on the basis of the signal.

6. A method according to claim 5, wherein the second beam contains visible light and the opening is defined by a glass material effective to absorb X-rays but to transmit visible light, wherein said method further comprises the step of transmitting visible light of the second beam through the glass material of the opening.

7. An exposure apparatus for manufacture of semiconductor devices, comprising:
   a synchrotron orbit radiation source generating a radiation beam comprising first and second beams;
   a beam line having a window supported by a support with an opening formed at least in a portion thereof, an inside of said beam line being maintained substantially in a vacuum through which a radiation beam from said synchrotron orbit radiation source can be propagated so that the first beam can be projected from said window; and
   an exposure system for receiving the first beam from said window and for projecting the first beam to a pattern, whereby an X-ray sensitive layer of a wafer can be exposed to the pattern, said exposure system being effective to detect the second beam through the opening of said support.

8. An apparatus according to claim 7, wherein the opening is defined by a glass material effective to absorb X-rays but to transmit visible light.

9. An apparatus according to claim 8, wherein the glass material is SiO$_2$.

10. An apparatus according to claim 7, wherein said exposure system includes a sensor for receiving the second beam and for producing a signal corresponding to the position of incidence of the second beam thereupon, and means for detecting the deviation of the first beam with respect to said exposure system on the basis of the signal from said sensor.

11. An apparatus according to claim 10, further comprising means for adjusting the attitude of said exposure system so as to correct the deviation.

12. An apparatus according to claim 10, further comprising means for adjusting the path of the radiation beam so as to correct the deviation.

13. An apparatus according to claim 7, wherein said exposure system includes a sensor for receiving the second beam and for producing a signal corresponding to the intensity of the second beam, and means for detecting the intensity of the first beam on the basis of the signal from said sensor.

14. An apparatus according to claim 7, wherein said beam line includes a convex mirror effective to reflect and expand the radiation beam from said synchrotron orbit radiation source and to direct the radiation beam to said window.

15. An apparatus according to claim 7, wherein said supporting member is formed with first and second openings each binge defined by a glass material effective to absorb X-rays but to transmit visible light, the radiation beam further comprises a third beam which is detected through said first opening, wherein said radiation beam further comprises a fourth beam which is detected through said second opening, and wherein said exposure system includes a first sensor for receiving the third beam and for producing a signal corresponding to the position of incidence of the fourth beam thereupon with respect to a first direction, a second sensor for receiving the fourth beam and for producing a signal corresponding to the position of incidence of the fourth beam thereupon with respect to a second direction perpendicular to said first direction, and means for detecting deviation of the first beam with respect to said exposure system in said first and second directions, on the basis of the signals from said first and second sensors.

16. An apparatus according to claim 7, wherein said opening of said supporting member is defined by a membrane and wherein said exposure system is arranged to detect the second beam through a glass member effective to absorb X-rays but to transmit visible light.

17. An exposure apparatus for the manufacture of semiconductor devices, and for exposing an X-ray sensitive layer on a wafer to a pattern of a mask, said apparatus comprising:
a synchrotron orbit radiation source for generating a radiation beam comprising first and second beams;
a beam line having a beryllium window supported by a support, said support having an opening formed at least in a portion thereof and effective to absorb X-rays but to transmit visible light, an inside of said beam line being maintained substantially in a vacuum through which a radiation beam from said synchrotron radiation source can be propagated so that the first beam can be projected from said window; and
an exposure system for receiving the first beam from said window and for receiving a second beam from said opening of said support, said exposure system directing the first beam to the pattern of the mask;
wherein said exposure system includes a first stage for supporting the mask, a second stage for supporting the wafer, means for collecting the second beam, a sensor for receiving the second beam from said collecting means and for producing a signal corresponding to the position of incidence of the second beam, means for adjusting the attitude of said exposure system, and control means for detecting the deviation of said exposure system with respect to the first beam on the basis of the signal from said sensor and for controlling said adjusting means to substantially correct the deviation.

18. An apparatus according to claim 17, wherein said opening of said supporting member is defined by a SiO$_2$ glass.

19. An apparatus according to claim 17, wherein said beam line includes a convex mirror effective to reflect and expand the radiation beam from said synchrotron orbit radiation source and to direct the radiation beam to said window.

20. A method according to claim 1, wherein said projecting step comprises the step of projecting a radiation beam comprising the first beam comprising a beam in an X-ray region and the second beam comprising a beam in a non-X-ray region.

21. A method according to claim 4, wherein said projecting step comprises the step of projecting a radiation beam comprising the first beam comprising a beam in an X-ray region and the second beam comprising a beam in a non-X-ray region.

22. An apparatus according to claim 7, wherein the first beam comprises a beam in an X-ray region and the second beam comprises a beam in a non-X-ray region.

23. An apparatus according to claim 17, wherein the first beam comprises a beam in an X-ray region and the second beam comprises a beam in a non-X-ray region.

24. A semiconductor device manufacturing method comprising the steps of:
introducing a radiation beam from a synchrotron radiation source into a substantially vacuum ambience, wherein the radiation beam includes a first beam in an X-ray region effective to sensitize an X-ray sensitive layer on a wafer, and a second beam in a non-X-ray region, passing the first beam through a window and out of the ambience, and passing the second beam through an opening formed in a portion of a member which supports the window;
detecting the second beam passing through the opening;
adjusting the relative position of the wafer and the first beam on the basis of the detection in said detecting step; and
exposing the X-ray sensitive layer of the wafer with the first beam passing through the window.

25. A semiconductor device manufacturing method comprising the steps of:
introducing a radiation beam from a synchrotron radiation source into a substantially vacuum ambience, wherein the radiation beam includes a first beam in an X-ray region, effective to sensitize an X-ray sensitive layer on a wafer, and a second beam in a non-X-ray region, passing the first beam through a window and out of the ambience, passing the second beam through an opening formed in a portion of a member which supports the window;
detecting the second beam passing through the opening;
detecting the intensity of the first beam on the basis of the detection in said detecting step; and
exposing the X-ray sensitive layer of the wafer with the first beam passing through the window.

* * * * *

UNITED STATES PATENT AND TRADEMARK OFFICE
CERTIFICATE OF CORRECTION

PATENT NO. : 5,168,512      Page 1 of 2
DATED : December 1, 1992
INVENTOR(S) : KAZUNORI IWAMOTO, ET AL.

It is certified that error appears in the above-identified patent and that said Letters Patent is hereby corrected as shown below:

IN THE DRAWINGS:

SHEET 9 OF THE DRAWINGS

FIG. 10

"PRESSUR" should read --PRESSURE--.

COLUMN 1

Line 26, "a plane of" should read --plane of a--.

COLUMN 2

Line 22, "as" (second occurrence) should read --a--.

COLUMN 3
    Line 49, "for the" should read --of the--.
    Line 50, "of" (first occurrence) should read --for the--.
    Line 58, "beam:" should read --beam,--.

COLUMN 7

Line 6, "$10^{31\ 10}$" should read --$10^{-10}$--.
    Line 51, "denoted and" should read --and denoted--.
    Line 59, "electopneumatic" should read --electropneumatic--.

UNITED STATES PATENT AND TRADEMARK OFFICE
CERTIFICATE OF CORRECTION

PATENT NO. : 5,168,512
DATED : December 1, 1992
INVENTOR(S) : KAZUNORI IWAMOTO, ET AL.

It is certified that error appears in the above-identified patent and that said Letters Patent is hereby corrected as shown below:

COLUMN 12

Line 2, "axis" should read --axis.--.

COLUMN 13

Line 14, "may" should read --main--.
Line 55, "$\Omega y$" should read --$\omega y$--.

COLUMN 14

Line 1, "beam," should read --beam--.

COLUMN 15

Line 27, "binge" should read --being--.
Line 35, "incidence of the fourth beam" should read --incidence of the third beam--.

Signed and Sealed this

Twenty-second Day of February, 1994

Attest:

BRUCE LEHMAN

Attesting Officer       Commissioner of Patents and Trademarks